United States Patent
Jeong (10) Patent No.: US 12,040,794 B2
(45) Date of Patent: Jul. 16, 2024

(54) SEMICONDUCTOR INTEGRATED CIRCUITS THAT SUPPORT ENHANCED SIGNAL MULTIPLEXING OPERATIONS FOR I/O BUFFERS

(71) Applicant: Samsung Electronics Co., Ltd., Suwon-si (KR)

(72) Inventor: Jin Su Jeong, Wonju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 137 days.

(21) Appl. No.: 17/823,481

(22) Filed: Aug. 30, 2022

(65) Prior Publication Data
US 2023/0084654 A1 Mar. 16, 2023

(30) Foreign Application Priority Data
Sep. 14, 2021 (KR) .................. 10-2021-0122654

(51) Int. Cl.
*H03K 19/0175* (2006.01)
(52) U.S. Cl.
CPC ............... *H03K 19/017509* (2013.01)
(58) Field of Classification Search
CPC ... H03K 19/018521; H03K 19/017509; H03K 19/00361; H03K 17/162; H03K 19/018507; H03K 3/35613; H03K 3/356113; H03K 19/0013; H03K 3/012; H03K 3/356182; H03K 19/003; H03K 19/0185; H03K 17/6871; H03K 19/00; H03K 19/018557; H03K 19/173; H03K 3/356104; H03K 3/356156; H03K 3/356191; H03K 5/08; H03K 5/133; H03K 5/2472

See application file for complete search history.

(56) References Cited

U.S. PATENT DOCUMENTS

| | | | |
|---|---|---|---|
| 7,288,962 B2 | 10/2007 | Taylor | |
| 7,471,113 B1 | 12/2008 | Lim | |
| 8,719,459 B2 | 5/2014 | Ripley | |
| 9,030,248 B2 | 5/2015 | Kim et al. | |
| 9,385,690 B1* | 7/2016 | Agarwal | H03K 19/1732 |
| 9,490,813 B2 | 11/2016 | Bowles et al. | |
| 9,917,589 B2 | 3/2018 | Koo et al. | |
| 10,686,438 B2 | 6/2020 | Yu et al. | |
| 2009/0259864 A1* | 10/2009 | Li | G06F 1/3203 |
| | | | 713/323 |

\* cited by examiner

*Primary Examiner* — Lincoln D Donovan
*Assistant Examiner* — Tyler J Pereny
(74) *Attorney, Agent, or Firm* — Myers Bigel, P.A.

(57) ABSTRACT

An input/output module includes a multiplexing circuit, which is responsive to a plurality of I/O signals and configured to output a selected one of the plurality of I/O signals according to a value of a common input signal received at a control terminal thereof. A level shifting circuit is provided, which is configured to convert a voltage level of the selected one of the plurality of I/O signals and a voltage level of the common input signal. At least two functional blocks are provided, which are each configured to receive the selected one of the plurality of I/O signals having the converted voltage level, yet operate in a mutually exclusive manner according to a value of the common input signal having the converted voltage level.

20 Claims, 7 Drawing Sheets

| c | a | b | ls_a_b | ls_c |
|---|---|---|--------|------|
| 0 | 0 | 0 | 0 | 0 |
| 0 | 0 | 1 | 1 | 0 |
| 0 | 1 | 0 | 0 | 0 |
| 0 | 1 | 1 | 1 | 0 |
| 1 | 0 | 0 | 0 | 1 |
| 1 | 0 | 1 | 0 | 1 |
| 1 | 1 | 0 | 1 | 1 |
| 1 | 1 | 1 | 1 | 1 |

SEMICONDUCTOR INTEGRATED CIRCUITS THAT SUPPORT ENHANCED SIGNAL MULTIPLEXING OPERATIONS FOR I/O BUFFERS

REFERENCE TO PRIORITY APPLICATION

This application claims priority to Korean Patent Application No. 10-2021-0122654, filed Sep. 14, 2021, the disclosure of which is hereby incorporated herein by reference.

FIELD OF THE INVENTION

The present disclosure relates to semiconductor integrated circuits and, more particularly, to general purpose input/output ports for semiconductor integrated circuits.

BACKGROUND

A semiconductor integrated circuit may include a plurality of functional blocks or devices configured to perform various functions. The functional blocks and devices in a semiconductor integrated circuit may be configured to communicate with each other in various manners.

As an example, a plurality of functions (IP) or a plurality of devices in the semiconductor integrated circuit may communicate with external devices (outside of the integrated circuit) through general purpose input/output (GPIO) ports. However, as the sizes of semiconductor integrated circuit continue to decrease, a reduced area occupied by a plurality of GPIO modules should also be considered.

SUMMARY

Aspects of the present disclosure provide a semiconductor integrated circuit having a decreased area of general purpose input/output ports and improved performance, and an operation method thereof.

One embodiment of the present invention provides an semiconductor integrated circuit including a general purpose input/output (GPIO) module. This GPIO module includes a plurality of input/output pins (each receiving a plurality of input/output signals including a common input signal), a multiplexing circuit selectively outputting the plurality of input/output signals according to the common input signal, a level shifting circuit converting a voltage level of the output signal of the multiplexing circuit and a voltage level of the common input signal, and at least two functional blocks receiving the converted output signal and operating in a mutually exclusive manner according to the converted common input signal.

Another embodiment of the present invention provides an semiconductor integrated circuit including an input/output interface receiving a plurality of input/output signals and outputting at least some input/output signals selected among the plurality of input/output signals, a level shifting circuit converting voltage levels of the at least some input/output signals output from the input/output interface, a transmission block inputting and outputting transmission input/output signals of which levels are converted, a reception block inputting and outputting reception input/output signals of which levels are converted and a pull-up/pull-down block inputting and outputting pull input and output signals of which levels are converted. According to these embodiments, the transmission block and the pull-up/pull-down block operate in a mutually exclusive manner according to a value of an output enable (OE) signal.

Other embodiments of the present invention provide a semiconductor integrated circuit having n input/output pins (n is a natural number of 1 or more) transmitting and receiving n input/output signals to/from the outside through a channel. These n input/output signals include a first input/output signal, a second input/output signal, and a common input signal. At least two multiplexing circuits are provided, which selectively output a first-first input/output signal of the first input/output signal and a second-first input/output signal of the second input/output signal according to the common input signal. At least two level shifting circuits are provided, which convert levels of outputs of the at least two multiplexing circuits, respectively, and at least two functional blocks are provided, which receive both outputs of the at least two level shifting circuits and operate in a mutually exclusive manner according to a logic state of the common input signal of which a level is converted.

According to further embodiments of the present invention, a general purpose input/output (GPIO) module can include a multiplexing circuit, which is responsive to a plurality of I/O signals and configured to output a selected one of the plurality of I/O signals according to a value of a common input signal received at a control terminal thereof. A level shifting circuit is also provided, which is configured to convert a voltage level of the selected one of the plurality of I/O signals and a voltage level of the common input signal. And, at least two functional blocks are provided, which are each configured to receive the selected one of the plurality of I/O signals having the converted voltage level, yet operate in a mutually exclusive manner according to a value of the common input signal having the converted voltage level.

In some of these embodiments, a first of the at least two functional blocks is active in response to the common input signal having a first value, however, a second of the at least two functional blocks is active in response to the common input signal having a second value unequal to the first value. Moreover, the first of the at least two functional blocks may be inactive in response to the common input signal having the second value, whereas the second of the at least two functional blocks may be inactive in response to the common input signal having the first value. The level shifting circuit may also include a first level shifter having an input terminal electrically coupled to an output of the multiplexing circuit, and a second level shifter having an input terminal electrically coupled to the control terminal of the multiplexing circuit.

According to additional embodiments of the invention, a general purpose input/output (GPIO) module is provided, which includes: (i) a first multiplexer having a first plurality of input terminals configured to receive a corresponding first plurality of input signals, and a select terminal configured to receive an output enable signal, and (ii) a second multiplexer having a second plurality of input terminals configured to receive a corresponding second plurality of input signals, and a select terminal configured to receive the output enable signal. A first functional block may also be provided, which is configured to receive: (i) a version of a signal generated at an output of the first multiplexer, (ii) a version of a signal generated at an output of the second multiplexer, and (iii) a version of the output enable signal. In some embodiments, the first functional block may be configured to be enabled when the version of output enable signal has a first logic value, but be disabled when the version of the output enable signal has a second logic value. In addition, a second functional block may be provided, which is configured to receive: (i) the version of the signal generated at an output of the first multiplexer, (ii) the version of the signal generated at an output of the second multiplexer, and (iii) the version of the output enable signal. In some embodiments, the second functional block may be configured to be enabled when the version of the output enable signal has the second logic value, but be disabled when the version of the output enable signal has the first logic value.

According to some of these embodiments of the invention, the version of the signal generated at the output of the first multiplexer is a level shifted version generated by a first level shifting circuit, whereas the version of the signal generated at the output of the second multiplexer is a level shifted version generated by a second level shifting circuit. The version of the output enable signal may also be a level shifted version of the output enable signal generated by a third level shifting circuit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Terms such as "block", "unit", "machine", "logic", "buffer", and the like, used herein or components corresponding to these terms may be implemented in the form of software, hardware, or combinations thereof. Hereinafter, semiconductor integrated circuits according to some exemplary embodiments of the present disclosure will be described with reference to FIGS. 1 to 9.

Figure 1:
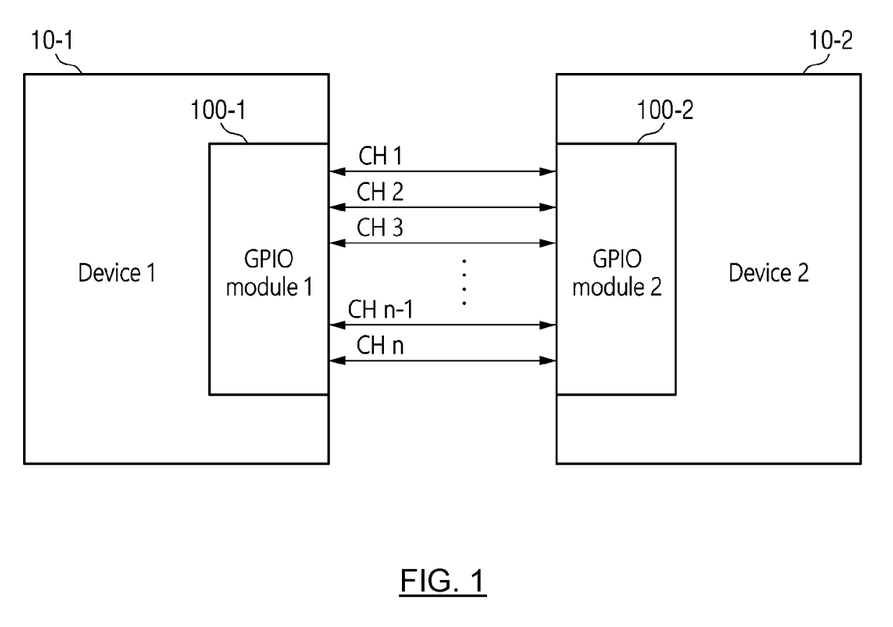
FIG. 1 is a block diagram illustrating semiconductor integrated circuits according to some exemplary embodiments.

FIG. 1 is a block diagram illustrating semiconductor integrated circuits according to some exemplary embodiments. Referring to FIG. 1, each of semiconductor integrated circuits 10-1 and 10-2 includes hardware functional blocks configured to perform specific functions or is configured to perform specific functions. For example, each of the semiconductor integrated circuits 10-1 and 10-2 may be a system on chip (SoC) such as an application processor (AP), a complementary metal oxide semiconductor (CMOS) image sensor (CIS), a power management integrated chip (PMIC), a display driver IC (DDI), and a touch screen panel (TSP) (e.g., a touch driver IC), and according to some exemplary embodiments, the semiconductor integrated circuit 10-1 and the semiconductor integrated circuit 10-2 may be different semiconductor integrated circuits.

The semiconductor integrated circuits 10-1 and 10-2 may be configured to communicate with each other based on a specific interface or a specific protocol. For example, as illustrated in FIG. 1, the semiconductor integrated circuits 10-1 and 10-2 may include general purpose input/output (GPIO) modules 100-1 and 100-2, respectively, which support bidirectional interface communication between the integrated circuits 10-1, 10-2.

Typically, a relatively low voltage needs to be used within the inner cores of the semiconductor integrated circuits 100-1 and 100-2 in order to implement low-power/high-speed operation, and a relatively high voltage typically needs to be used outside the semiconductor integrated circuits 100-1 and 100-2 in order to meet certain noise immunity and communication standards. For this reason, the GPIO modules 100-1 and 100-2 perform signal level shifting so that signals may be transferred in different voltage domains.

The GPIO modules 100-1 and 100-2 may transmit and receive hardware signals to and from each other through a plurality of physical signal lines CH1 to CHn (where n is a positive integer greater than one). In this case, each of the GPIO modules 100-1 and 100-2 may include GPIOs corresponding to the number of signal lines. The hardware signals may refer to information transmitted and received between the hardware functional blocks included within each of the semiconductor integrated circuit 10-1 and the semiconductor integrated circuit 10-2. In addition, the semiconductor integrated circuit 10-1 and the semiconductor integrated circuit 10-2 may communicate with each other based on a predetermined communication manner (e.g., GPIO communication protocol). In a case of the GPIO communication manner, communication between devices (or hardware blocks included in the devices) is possible without the intervention of a separate central processing unit (CPU) or software.

Figure 2:
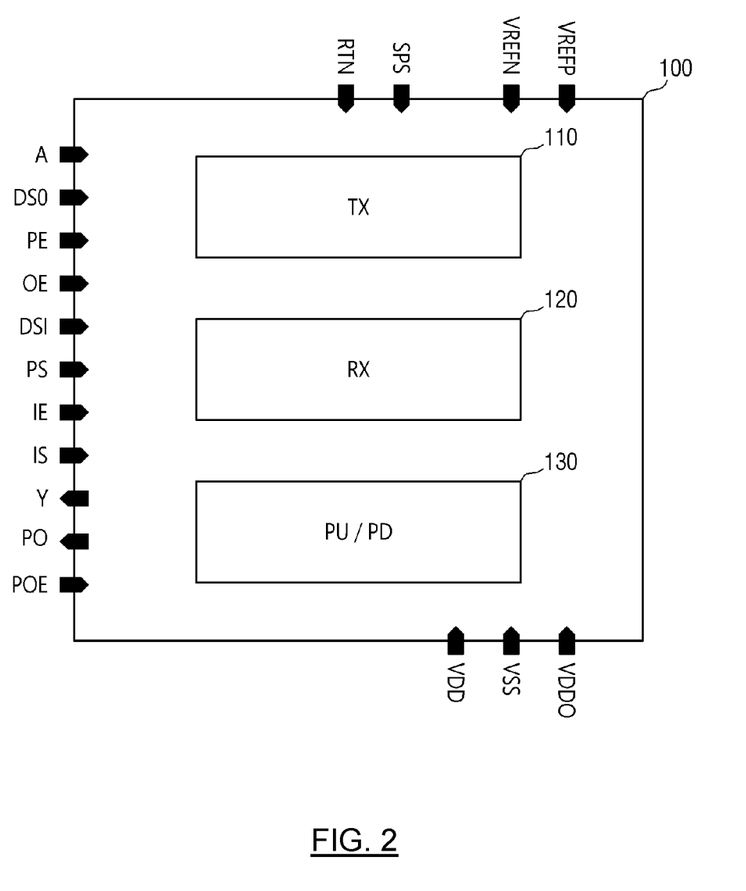
FIG. 2 is a block diagram illustrating a general purpose input/output (GPIO) module according to some exemplary embodiments.

FIG. 2 is a block diagram illustrating a general purpose input/output (GPIO) module according to some exemplary embodiments. Referring to FIG. 2, a GPIO module 100 may include a transmitter circuit 110, a receiver circuit 120, and/or a pull-up/pull-down circuit 130 according to some exemplary embodiments. As will be understood by those skilled in the art, the transmitter circuit 110 is a circuit for transmitting information from the inside of the semiconductor integrated circuit 10 to the outside, the receiver circuit 120 is a circuit for receiving information in the inside of the semiconductor integrated circuit 20 from the outside, and the pull-up/pull-down circuit 130 is a circuit for preventing an undefinable input. The pull-up/pull-down circuit 130 is to ensure a known state for a signal. For example, the pull-up/pull-down circuit 130 includes a plurality of resistors with relatively high resistance, called a weak pull-up or weak pull-down. The pull-up/pull-down circuit 130 pulls the output high or low more slowly, but draws less current. The transmitter circuit 110 and the receiver circuit 120 may include (and be referred to as) an output buffer circuit and an input buffer circuit, respectively, according to another exemplary embodiment.

The GPIO module 100 includes signal pins such as an output enable signal pin OE, a strength selection signal pin DS, an input enable signal pin IE, a Schmitt trigger selection signal pin IS, a pull enable signal pin PE, a pull selection signal pin PS, an "input" data signal pin A from the outside, an "output" data signal pin Y to the outside, a test enable pin POE, and a test output pin PO. The transmitter circuit 110 includes the output enable signal pin OE, the strength selection signal pin DS, and a data pin A from a core among the signal pins, and the receiver circuit 120 includes the input enable signal pin IE, the Schmitt trigger selection signal pin IS, a data pin Y to the core, the test enable pin POE, and the test output pin PO among the signal pins. The pull-up/pull-down circuit 130 includes the pull enable signal pin PE and the pull select signal pin PS among the signal pins.

The semiconductor integrated circuit 10 may have a function programmable in an input/output interface, and includes a level shifter for control for each function. According to some exemplary embodiment, the semiconductor integrated circuit 10 may include about ten level shifters for each GPIO port in order to implement a programmable operation. The GPIO module 100 may further include power supply pins VDD and VSS and reference voltage pins VREFP and VREFN required for operating the respective components 110, 120, and 130.

Figure 3:
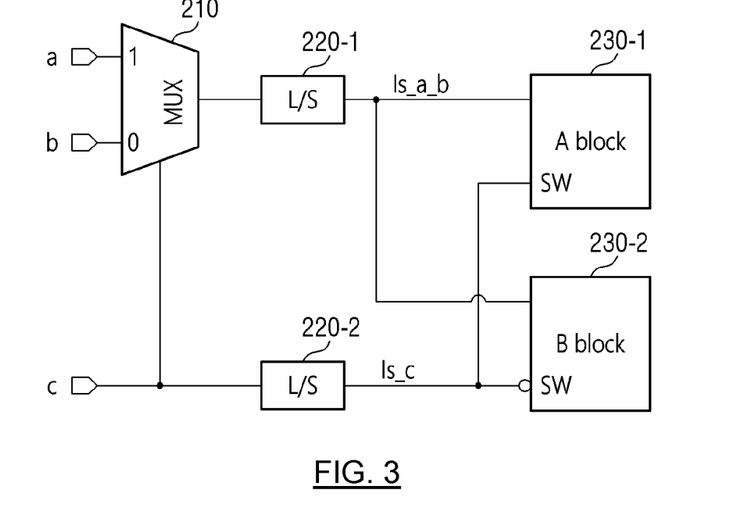
FIG. 3 is a diagram illustrating the GPIO module of FIG. 2 by way of example.

FIG. 3 is a diagram illustrating the GPIO module of FIG. 2 by way of example. Referring to FIG. 3, a GPIO module 200 may include a multiplexing circuit 210, a level shifting circuit 220, and functional blocks 230-1 and 230-2. The GPIO module 200 receives a plurality of input signals a, b, and c, and it is assumed that the functional block 230-1 takes a common input signal c and a first input signal a as inputs and the functional block 230-2 takes the common input signal c and a second input signal b as inputs. In this case, the plurality of input signals a, b, and c may be signals output from an input/output interface circuit 110 described with reference to FIG. 2. The input/output interface circuit 110 also called a transmitting circuit. The following description is only an example, and it will be described by way of example in an exemplary embodiment illustrated in FIG. 3 that multiplexing is performed on two inputs, but the present disclosure may also be applied to a case where there is an exclusively output signal (OE in an example illustrated in FIG. 2) when multiplexing and an operation are performed on two or more inputs such as three inputs or four inputs, according to various exemplary embodiments.

The multiplexing circuit 210 receives the input signals a and b, selects any one of the input signals a and b according to the common input signal c, and inputs the selected input signal to any one of the functional blocks 230-1 and 230-2. As an example, when the common input signal c is '1' (logic high), the input signal a may be selected and output, and when the common input signal c is '0' (logic low), the input signal b may be selected and output. Alternatively, as another example, the input signal a or the input signal b may be output in a state in which the common input signal c is set opposite to that described above.

The GPIO module 200 may include level shifting circuits 220 of which the number is based on the sum of the number of multiplexing circuits 210 and the number of channels of the common input signal. In an example illustrated in FIG. 3, level shifting circuits 220-1 and 220-2 are connected to each of an output of the multiplexing circuit 210 and the common input signal c, and thus, the GPIO module 200 may include two level shifting circuits. The level shifting circuit 220-1 may shift a voltage level of an output signal selected by the multiplexing circuit 210 and output the output signal Is_a_b of which the voltage level is shifted. The level shifting circuit 220-2 may shift a voltage level of the common input signal c and output the common input signal Is_c of which the voltage level is shifted.

The functional block (A block) 230-1 operates in an exclusive manner with the functional block (B block) 230-2 on the basis of the common input signal c. Specifically, when the common input signal c is activated, the functional block 230-1 may be activated, but the functional block 230-2 may be deactivated, and when the common input signal c is deactivated, the functional block 230-1 may be deactivated, but the functional block 230-2 may be activated. In an example illustrated in FIG. 3, the functional block (A block) 230-1 receives the common input signal Is_c of which the voltage level is shifted as a switching signal SW, and the functional block (B block) 230-2 inverts the common input signal Is_c of which the voltage level is shifted and receives the inverted common input signal as a switching signal SW. That is, the functional block (A block) 230-1 and the functional block (B block) 230-2 may not operate at the same time, and may be activated opposite to each other based on the common input signal c.

Figure 4:
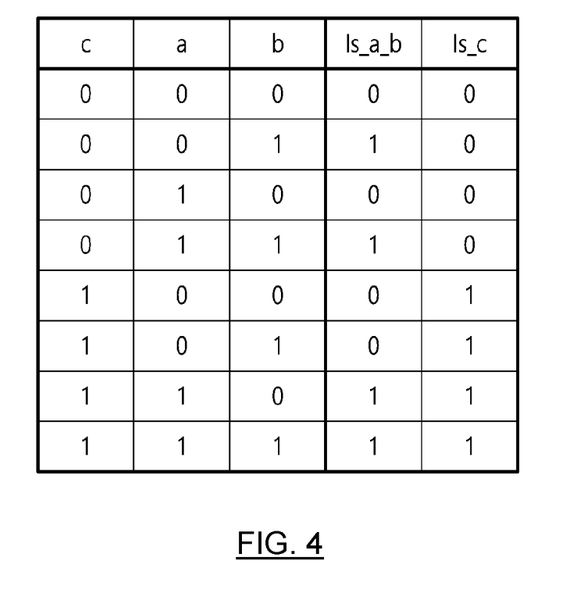
FIG. 4 is a state table for describing an operation of the GPIO module of FIG. 3.

FIG. 4 is a state table for describing an operation of the GPIO module of FIG. 3. Referring to FIGS. 3 and 4, the level shifting circuit 220-1 shifts a level of the input signal selected by the multiplexing circuit 210 according to the common input signal c and outputs the signal of which the level is shifted. In the state table illustrated in FIG. 4, in a case where the input signals (a, b)=[(0, 0), (0, 1), (1, 0), (1, 1)], when the common input signal c is 0, the multiplexing circuit 210 selects the input signal b, and thus, the level shifting circuit 220-1 outputs Is_a_b=[0, 1, 0, 1]. On the other hand, when the common input signal c is 1, the multiplexing circuit 210 selects the input signal a, and thus, the level shifting circuit 220-1 outputs Is_a_b=[0, 0, 1, 1].

Figure 5:
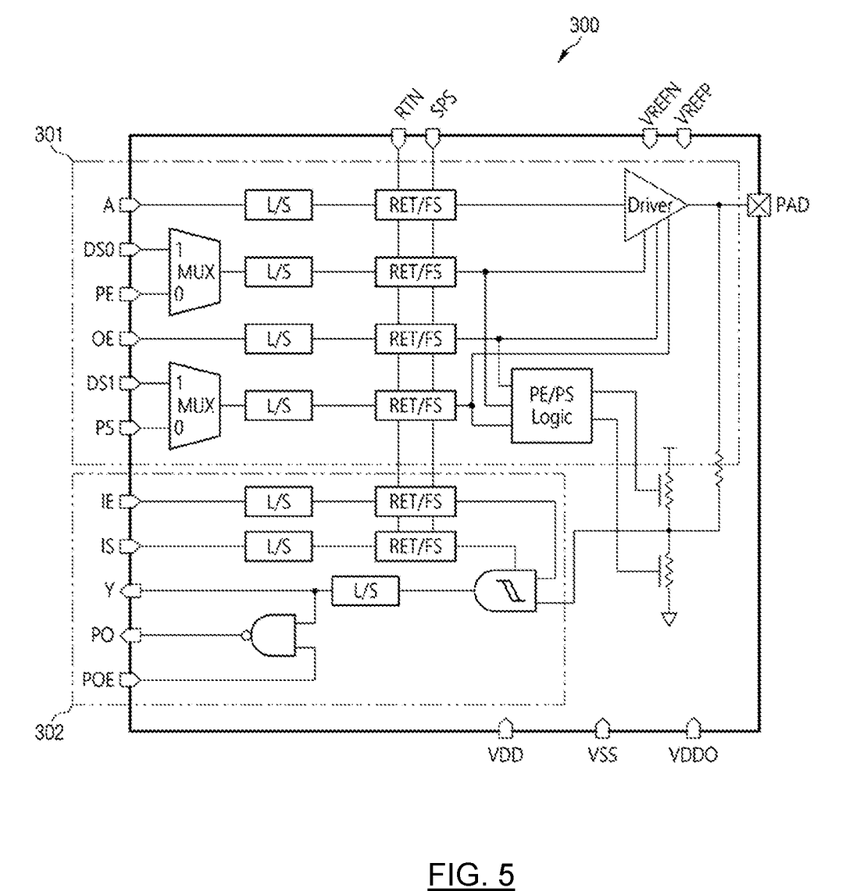
FIG. 5 is a diagram illustrating the GPIO module of FIG. 2 by way of example.

FIG. 5 is a diagram illustrating the GPIO module of FIG. 2 by way of an example embodiment. Referring now to FIG. 5, a GPIO module 300 includes a combination circuit 301 and a receiver circuit 302. The combination circuit 301 is a circuit that combines a transmitter circuit with a pull-up/pull-down circuit, and further includes an output enable signal pin OE, strength select signal pins DS0, DS1, a data pin A output from a core, a pull enable signal pin PE, and a pull selection signal pin PS as input output pins. The combination circuit 301 further includes voltage bias level pins VREFN, VREFP, a retention mode enable pin RTN, a failsafe mode selection pin SPS, retention-failsafe circuit blocks RET/FS, a pull-up and pull-down control logic circuit PE/PS logic, an output driver. The retention-failsafe circuit blocks RET/FS performs retention function and failsafe function. For example, when the device 10-1 or 10-2 enters a sleep mode, the device 10-1 or 10-2 keeps (or retentions) control data of the GPIO module 100-1 or 100-2 in the retention-failsafe circuit blocks RET/FS. Or, for example, the device 10-1 including the GPIO module 100-1 have an independent power supply source with the device 10-2 including the GPIO module 100-2 for the failsafe function. The device 10-1 may survive the loss/failure of any power supply indefinitely without causing a reliability or functionality hazard in the device 10-2 or in any of the still powered-up devices. The output driver the data signal of the data pin A to the pin PAD according to the Is_DS0_PE, Is_DS1_PS and OE signals.

In addition, the receiver circuit 302 includes an input enable signal pin IE, a Schmitt-trigger select signal pin IS, a data pin Y to the core, a test enable pin POE, and a test output pin PO as input/output pins. The test output pin PO outputs a test output signal when a test enable signal of the test enable pin POE and a data signal of the data pin Y performs NAND operation. The data pin Y is a result signal of Schmitt-trigger operation between a signal of the input enable signal pin IE and a signal of the PAD signal according to a signal of the Schmitt-trigger select signal pin IS. The receiver circuit 302 also includes the retention-failsafe circuit blocks RET/FS to perform a retention function according to the retention mode enable signal of the retention mode enable pin RTN and a failsafe function according to the failsafe mode selection signal of the failsafe mode selection signal pin SPS. The input enable signal of pin IE and the Schmitt-trigger select signal of pin IS are output via the retention-failsafe circuit blocks RET/FS.

The level shifting circuits L/S convert external signals P1 to Pn of the semiconductor integrated circuit 10 into internal operating voltage levels of the semiconductor integrated circuit 10. A low operating voltage may be used inside the semiconductor integrated circuit 10 in order to perform a low-power and fast operation, and a relatively high operating voltage may be used outside the semiconductor integrated circuit 10 in order to meet noise immunity and communication standards. Meanwhile, programmable functional blocks may independently use the level shifting circuits L/S, respectively. And, in order to further decrease an area occupied by the GPIO module 300, a level shifting circuit L/S may be shared by at least two functional blocks triggered based on a common input signal and operating in a mutually exclusive manner. As will be understood by those skilled in the art, operation in a mutually exclusive manner refers to an operation relationship in which a second functional block does not operate when a first functional block operates and the first functional block does not operate when the second functional block operates.

In an example illustrated in FIG. 2, a transmission block (e.g., 110 of FIG. 2) and a pull-up/pull-down block (e.g., 130 of FIG. 2) may operate in a mutually exclusive manner using an OE signal as a common input signal. A detailed description of an operation will be provided hereinbelow with reference to FIGS. 6 to 9.

Figure 6:
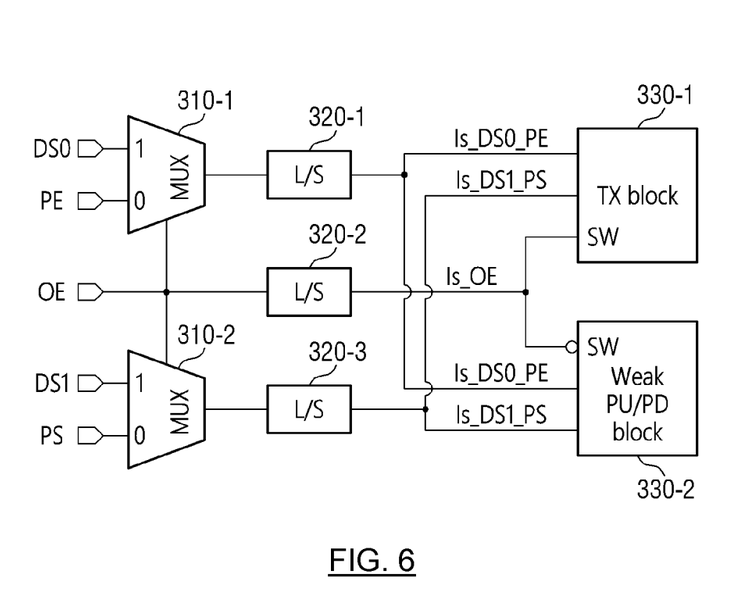
FIG. 6 is a diagram illustrating the GPIO module of FIG. 2 by way of example.
Figure 7:
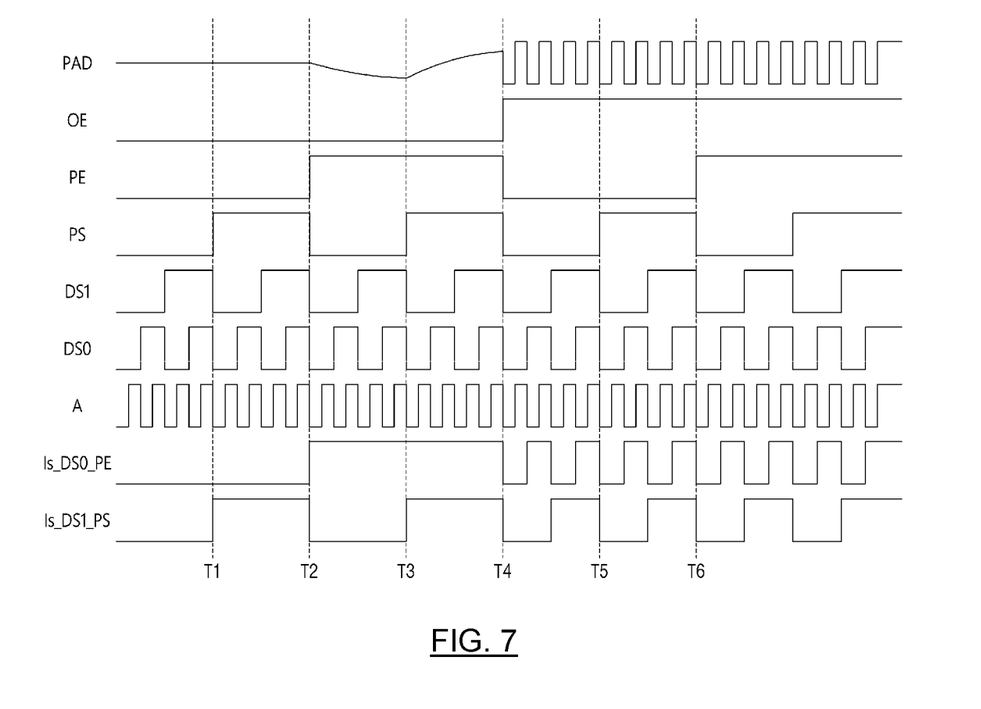
FIG. 7 is a timing diagram illustrating an operation of the GPIO module of FIG. 6.

FIG. 6 is a diagram illustrating the GPIO module of FIG. 2 by way of another example, and FIG. 7 is a timing diagram illustrating an operation of the GPIO module of FIG. 6. Referring to FIGS. 6 and 7, the GPIO module 300 includes multiplexing circuits 310-1 and 310-2, level shifting circuits 320-1, 320-2, and 320-3, and function circuits 330-1 and 330-2. The multiplexing circuits 310-1 and 310-2 selectively output an input signal according to a common input signal (e.g., OE).

Referring to FIGS. 6 and 7, the GPIO module 300 transmits and receives OE, PE, PS, DS[1], and DS[0] signals through input/output pins. The level shifting circuits 320 convert levels of Is_DS0_PE, Is_DS1_PS, and OE signals and output the signals of which the levels are converted. In this case, signals received through the input/output pins are selectively output from at least two multiplexing circuits 310 according to a value of the common input signal.

For example, states of a transmission block (TX block) 330-1 and a pull-up/pull-down block 330-2 are maintained to be opposite to each other. Thus, when the state of the transmission block is enabled, the state of the pull-up/pull-down block is disabled. Alternatively, when the state of the transmission block is disabled, the state of the pull-up/pull-down block is enabled. Thus, the states of the two blocks (and a pad (not shown) coupled thereto) are determined according to the logic value of the OE signal.

Thus, as shown by the timing diagram of FIG. 7, when the OE signal is in a logic low state from time 0 to time T4, the transmission block is deactivated and the pull-up/pull-down block is activated. Specifically, the PE signal is output from the multiplexing circuit 310-1 according to the OE signal, and the level shifting circuit 320-1 converts a voltage level of the output signal of the multiplexing circuit 310-1 and outputs the signal of which the voltage level is converted. That is, Is_DS0_PE has the same logic state as the PE signal from time 0 to time T4. In addition, the PS signal is output from the multiplexing circuit 310-2, and the level shifting circuit 320-3 converts a voltage level of the output signal of the multiplexing circuit 310-2 and outputs the signal of which the voltage level is converted. That is, Is_DS1_PS has the same logic state as the PS signal from time 0 to time T4. The pull-up/pull-down block 330-2 is activated, and performs a pull-up/pull-down operation based on the Is_DS0_PE and Is_DS1_PS signals.

Subsequently, when the OE signal is in a logic high state from time T4 to a time after time T6, the transmission block is activated and the pull-up/pull-down block is deactivated. Specifically, the DS[0] signal is output from the multiplexing circuit 310-1 according to the OE signal, and the level shifting circuit 320-1 converts a voltage level of the output signal of the multiplexing circuit 310-1 and outputs the signal of which the voltage level is converted. That is, Is_DS0_PE has the same logic state as the DS[0] signal from time T4 to time T6. In addition, the DS[1] signal is output from the multiplexing circuit 310-2, and the level shifting circuit 320-3 converts a voltage level of the output signal of the multiplexing circuit 310-2 and outputs the signal of which the voltage level is converted. That is, Is_DS1_PS has the same logic state as the DS[1] signal from time T4 to time T6. The data signal A output from core is output to pin PAD via the level-shifting circuit L/S, the retention-failsafe block RET/FS and the output driver referred in FIG. 5. The output driver outputs the data signal of the data pin A to the pin PAD according to the Is_DS0_PE, Is_DS1_PS, and OE signals. Thus, the PAD signal has same logic state as the data signal A from time T4 according to OE signal.

That is, a smaller number of level shifting circuits may be implemented by using the multiplexing circuit outputting the input signal based on the common input signal according to an exemplary embodiment of the present disclosure, and the multiplexing circuit occupies a smaller area than the level shifting circuit, which is advantageous in a layout design of the GPIO module.

Figure 8:
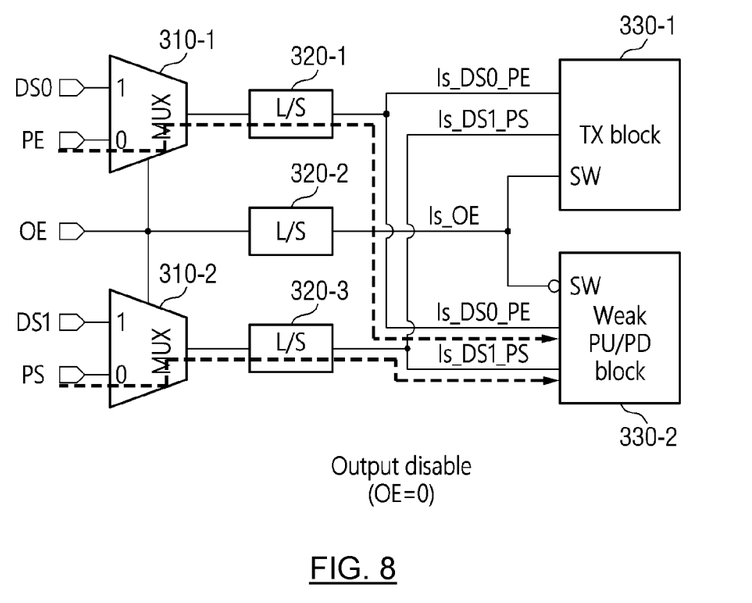
FIG. 8 is a diagram illustrating an operation of the GPIO module of FIG. 6 according to an exemplary embodiment.

FIG. 8 is a diagram illustrating an operation of the GPIO module of FIG. 6 according to an exemplary embodiment. For example, an operation when the common input signal OE is 0 (logic low) will be described with reference to FIG. 8. The multiplexing circuit 310-1 outputs PE according to the common input signal OE, and the multiplexing circuit 310-2 outputs PS according to the common input signal OE. The level shifting circuit 320-1 outputs Is_DS0_PE (=Is_PE) obtained by converting a level of PE output from the multiplexing circuit 310-1 to the transmission block 330-1 and the pull-up/pull-down block 330-2. The level shifting circuit 320-2 outputs Is_OE obtained by converting a level of the common input signal OE to the transmission block 330-1 and the pull-up/pull-down block 330-2. The level shifting circuit 320-3 outputs Is_DS1_PS (=Is_PS) obtained by converting a level of PS output from the multiplexing circuit 310-2 to the transmission block 330-1 and the pull-up/pull-down block 330-2. The transmission block 330-1 is switched and deactivated according to the common input signal Is_OE (=0) of which the level is converted, and does not perform a transmission operation. The pull-up/pull-down block 330-2 is switched and activated according to a signal (=1) obtained by inverting the common input signal Is_OE (=0) of which the level is converted, and performs a pull-up/pull-down operation according to the input signals Is_PE and Is_PS of which levels are converted.

Figure 9:
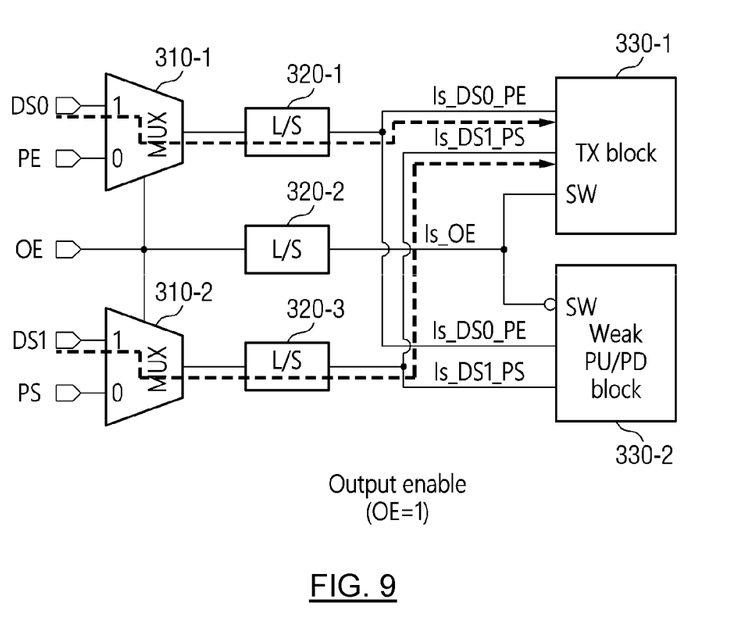
FIG. 9 is a diagram illustrating an operation of the GPIO module of FIG. 6 according to another exemplary embodiment.

FIG. 9 is a diagram illustrating an operation of the GPIO module of FIG. 5 according to another exemplary embodiment. For example, an operation when the common input signal OE is 1 (logic high) will be described with reference to FIG. 9. The multiplexing circuit 310-1 outputs DS[0] according to the common input signal OE, and the multiplexing circuit 310-2 outputs DS[1] according to the common input signal OE. The level shifting circuit 320-1 outputs Is_DS0_PE (=Is_DS0) obtained by converting a level of DS[0] output from the multiplexing circuit 310-1 to the transmission block 330-1 and the pull-up/pull-down block 330-2. In addition, the level shifting circuit 320-2 outputs Is_OE obtained by converting a level of the common input signal OE to the transmission block 330-1 and the pull-up/pull-down block 330-2. The level shifting circuit 320-3 outputs Is_DS1_PS (=Is_DS1) obtained by converting a level of DS[1] output from the multiplexing circuit 310-2 to the transmission block 330-1 and the pull-up/pull-down block 330-2. The transmission block 330-1 is switched and activated according to the common input signal Is_OE (=1) of which the level is converted, and performs a transmission operation according to the input signals Is_DS0 and Is_DS1 of which the levels are converted. The pull-up/pull-down block 330-2 is switched and deactivated according to a signal (=0) obtained by inverting the common input signal Is_OE (=1) of which the level is converted, and does not perform a pull-up/pull-down operation.

Figure 10:
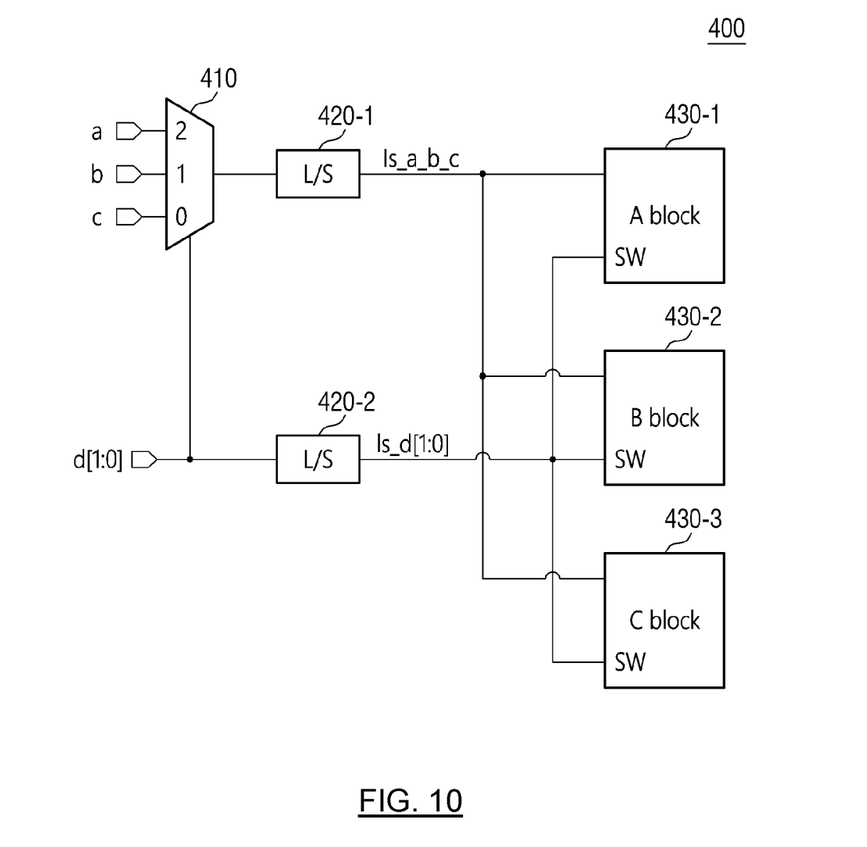
FIG. 10 is a diagram illustrating the GPIO module of FIG. 2 by way of example.

FIG. 10 is a diagram illustrating the GPIO module of FIG. 2 by way of example. Referring to FIG. 10, in a GPIO module 400, at least three functional blocks 430-1, 430-2, and 430-3 (e.g., transmission block, pull-up/pull-down block, etc.) may operate in a mutually exclusive manner based on a common input signal d[1:0] of 2 bits or more, which are provided to level shifting circuit 420-2. In this case, each functional block may receive a signal of (a, d), (b, d), or (c, d), and only one of all the functional blocks may be activated and operated according to the common input signal d[1:0].

For example, when d[1:0] is 2, the multiplexing circuit 410 outputs a, and the level shifting circuit 420-1 outputs a signal Is_a_b_c=Is_a of which a level is converted to the functional block (A block) 430-1. In this case, only the functional block 430-1 may be activated, and the functional blocks 430-2 and 430-3 may be deactivated. However, when d[1:0] is 1, the multiplexing circuit 410 outputs b, and the level shifting circuit 420-1 outputs a signal Is_a_b_c=Is_b of which a level is converted to the functional block (B block) 430-2. In this case, only the functional block 430-2 may be activated, and the functional blocks 430-1 and 430-3 may be deactivated. Finally, when d[1:0] is 0, the multiplexing circuit 410 outputs c, and the level shifting circuit 420-1 outputs a signal Is_a_b_c=Is_c of which a level is converted to the functional block (C block) 430-3. In this case, only the functional block 430-3 may be activated, and the functional blocks 430-1 and 430-2 may be deactivated.

That is, a smaller number of level shifting circuits may be implemented by using the multiplexing circuit outputting the input signal based on the common input signal according to an exemplary embodiment of the present disclosure, and the multiplexing circuit occupies a smaller area than the level shifting circuit, which is advantageous in a layout design of the GPIO module.

The three functional blocks operating in a mutually exclusive manner have been described in an example illustrated in FIG. 10, but the scope of the present disclosure is not limited thereto, and a case where there are a common input signal for triggering an exclusive operation and functional blocks operating in a mutually exclusive manner may correspond to an exemplary embodiment of the present disclosure regardless of the number of functional blocks.

The exemplary embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the exemplary embodiments described above are illustrative rather than being restrictive in all aspects.

What is claimed is:

1. A general purpose input/output (GPIO) module, comprising:
   a multiplexing circuit responsive to a plurality of I/O signals, said multiplexing circuit configured to output a selected one of the plurality of I/O signals according to a value of a common input signal received at a control terminal thereof;
   a level shifting circuit configured to convert a voltage level of the selected one of the plurality of I/O signals and a voltage level of the common input signal; and
   at least two functional blocks, which are each configured to receive the selected one of the plurality of I/O signals having the converted voltage level, yet operate in a mutually exclusive manner according to a value of the common input signal having the converted voltage level.

2. The GPIO module of claim 1, further comprising a plurality of input/output (I/O) pins configured to receive corresponding ones of the plurality of I/O signals and the common input signal.

3. The GPIO module of claim 1, wherein a first of the at least two functional blocks is active in response to the common input signal having a first value; and wherein a second of the at least two functional blocks is active in response to the common input signal having a second value unequal to the first value.

4. The GPIO module of claim 3, wherein the first of the at least two functional blocks is inactive in response to the common input signal having the second value; and wherein the second of the at least two functional blocks is inactive in response to the common input signal having the first value.

5. The GPIO module of claim 1, wherein the level shifting circuit comprises a first level shifter having an input terminal electrically coupled to an output of the multiplexing circuit, and a second level shifter having an input terminal electrically coupled to the control terminal of the multiplexing circuit.

6. The GPIO module of claim 1, wherein the multiplexing circuit comprises:
   a first multiplexer having input terminals responsive to a first group of the plurality of I/O signals; and
   a second multiplexer having input terminals responsive to a second group of the plurality of I/O signals; and wherein a control terminal of the first multiplexer and a control terminal of the second multiplexer are both responsive to the common input signal.

7. The GPIO module of claim 6, wherein the level shifting circuit comprises:
   a first level shifter having an input terminal electrically coupled to an output of the first multiplexer;
   a second level shifter having an input terminal electrically coupled to the control terminals of the first and second multiplexers; and
   a third level shifter having an input terminal electrically coupled to an output of the second multiplexer.

8. The GPIO module of claim 7,
   wherein a first of the at least two functional blocks is configured to receive signals output from each of the first, second and third level shifters;
   wherein a second of the at least two functional blocks is configured to receive signals output from each of the first, second and third level shifters; and
   wherein the signal output from the second level shifter functions as an enable signal that selectively enables the first of the at least two functional blocks and the second of the at least two functional blocks during non-overlapping time intervals.

9. The GPIO module of claim 6, wherein the first multiplexer has an input terminal responsive to a pull enable (PE) signal; and wherein the second multiplexer has an input terminal responsive to a pull select (PS) signal.

10. The GPIO module of claim 3, wherein the common input signal is a multi-bit digital signal.

11. A general purpose input/output (GPIO) module, comprising:
    a first multiplexer having a first plurality of input terminals configured to receive a corresponding first plurality of input signals, and a select terminal configured to receive an output enable signal;
    a second multiplexer having a second plurality of input terminals configured to receive a corresponding second plurality of input signals, and a select terminal configured to receive the output enable signal;
    a first functional block configured to receive: (i) a version of a signal generated at an output of the first multiplexer, (ii) a version of a signal generated at an output of the second multiplexer, and (iii) a version of the output enable signal, said first functional block configured to be enabled when the version of output enable signal has a first logic value, but be disabled when the version of the output enable signal has a second logic value; and
    a second functional block configured to receive: (i) the version of the signal generated at an output of the first multiplexer, (ii) the version of the signal generated at an output of the second multiplexer, and (iii) the version of the output enable signal, said second functional block configured to be enabled when the version of the output enable signal has the second logic value, but be disabled when the version of the output enable signal has the first logic value.

12. The GPIO module of claim 11, wherein the version of the signal generated at the output of the first multiplexer is a level shifted version generated by a first level shifting circuit; wherein the version of the signal generated at the output of the second multiplexer is a level shifted version generated by a second level shifting circuit; and wherein the version of the output enable signal is a level shifted version of the output enable signal generated by a third level shifting circuit.

13. The GPIO module of claim 12, wherein one of the first plurality of input signals is a pull enable (PE) signal; and wherein one of the second plurality of input signals is a pull select (PS) signal.

14. The GPIO module of claim 13, wherein both the pull enable (PE) signal and the pull select (PS) signal are provided to the first functional block when the version of output enable signal has the first logic value.

15. The GPIO module of claim 11, wherein one of the first plurality of input signals is a pull enable (PE) signal; and wherein one of the second plurality of input signals is a pull select (PS) signal.

16. The GPIO module of claim 15, wherein both the pull enable (PE) signal and the pull select (PS) signal are provided to the first functional block when the version of output enable signal has the first logic value.

17. A general purpose input/output (GPIO) module, comprising:
    a multiplexer having at least three input terminals configured to receive corresponding input signals, and a select terminal configured to receive a multi-bit common input signal;
    a first level shift circuit having an input electrically coupled to an output of said multiplexer;
    a second level shift circuit having an input configured to receive the multi-bit common input signal;
    a first functional block having a first input electrically coupled to an output of the first level shift circuit and a second input electrically coupled to an output of the second level shift circuit;
    a second functional block having a first input electrically coupled to the output of the first level shift circuit and a second input electrically coupled to the output of the second level shift circuit; and
    a third functional block having a first input electrically coupled to the output of the first level shift circuit and a second input electrically coupled to the output of the second level shift circuit;
    wherein at least two of the first, second and third functional blocks are configured to operate in a mutually exclusive manner according to a value of a level-shifted version of the multi-bit common input signal generated at the output of the second level shift circuit.

18. The GPIO module of claim 17, wherein the first, second and third functional blocks are configured to operate in a mutually exclusive manner according to a value of the level-shifted version of the multi-bit common input signal generated at the output of the second level shift circuit.

19. The GPIO module of claim 17, wherein the second level shift circuit is configured to level shift a corresponding voltage of each of the bits of the multi-bit common input signal received at the input thereof.

20. The GPIO module of claim 17, wherein at least one of the first, second and third functional blocks is a transmission block; and wherein at least another one of the first, second and third functional blocks is a pull-up/pull-down block.

* * * * *